(12) United States Patent
Kim

(10) Patent No.: US 12,024,771 B2
(45) Date of Patent: Jul. 2, 2024

(54) METHOD FOR MANUFACTURING DE-POWDER DEVICE FOR PIPING, AND METHOD FOR INSTALLING SAME

(71) Applicant: M. I Co., Ltd, Asan-si (KR)

(72) Inventor: Gi Nam Kim, Cheonan-si (KR)

( * ) Notice: Subject to any disclaimer, the term of this patent is extended or adjusted under 35 U.S.C. 154(b) by 0 days.

(21) Appl. No.: 18/271,858

(22) PCT Filed: Jan. 17, 2023

(86) PCT No.: PCT/KR2023/000786
§ 371 (c)(1),
(2) Date: Jul. 12, 2023

(87) PCT Pub. No.: WO2024/029677
PCT Pub. Date: Feb. 8, 2024

(65) Prior Publication Data
US 2024/0043995 A1  Feb. 8, 2024

(51) Int. Cl.
| | | |
|---|---|---|
| C23C 16/44 | (2006.01) | |
| F16L 53/38 | (2018.01) | |
| H01L 21/67 | (2006.01) | |
| H02G 1/14 | (2006.01) | |
| H05B 3/04 | (2006.01) | |

(Continued)

(52) U.S. Cl.
CPC ........... C23C 16/4412 (2013.01); H02G 1/14 (2013.01)

(58) Field of Classification Search
CPC ...... C23C 16/4412; C23C 16/44; F16L 53/38; H01L 21/67; H01L 21/02274; H01L 21/0262; H01L 21/205; H01L 21/67005; H01L 21/67098; H02G 1/14; H05B 3/04; H05B 3/06; H05B 3/52

USPC ................................................. 29/868, 898
See application file for complete search history.

(56) References Cited

FOREIGN PATENT DOCUMENTS

| CN | 102022601 A | * | 4/2011 | ......... C23C 16/4401 |
|---|---|---|---|---|
| JP | 2018-041945 A | | 3/2018 | |
| KR | 10-2000-0046754 A | | 7/2000 | |

(Continued)

*Primary Examiner* — Timothy J Thompson
*Assistant Examiner* — Guillermo J Egoavil

(57) ABSTRACT

The present disclosure relates to a method for manufacturing a de-powder device for piping and a method for installing the same, and more particularly, to a method for manufacturing a de-powder device for piping, which is for suppressing attachment and deposition of exhaust matters to an inner circumferential surface of a pipe exposed to the flow of exhaust matters such as unreacted raw material gas, reaction products, and the like exhausted from substrate processing devices for semiconductors and displays, and a method for installing the same.

The method for manufacturing a de-powder device for piping according to the present disclosure includes: a heater manufacturing step (S1) including a step (S11) of manufacturing an intermediate product by installing a heating wire connected to a power source inside a metal pipe and filling it with an insulating agent and a step (S12) of cutting the intermediate product and connecting one end portions of exposed heating wires; a winding step (S2) of manufacturing a heating coil which has a predetermined outer diameter by winding the heater around a jig and at least a portion of which is inserted into a pipe; and a coupling step (S3) of coupling the flange and the heating coil by inserting an end portion of the heating coil into an exposed hole formed in a metal flange.

9 Claims, 7 Drawing Sheets

(51) Int. Cl.
*H05B 3/06* (2006.01)
*H05B 3/52* (2006.01)

(56) References Cited

FOREIGN PATENT DOCUMENTS

| KR | 20-0219527 B | 4/2001 | |
|---|---|---|---|
| KR | 10-2004-0014856 A | 2/2004 | |
| KR | 101051938 B1 * | 7/2011 | ............. B29C 57/00 |
| KR | 101075170 B1 * | 10/2011 | ......... C23C 16/4401 |
| KR | 10-2013-0077286 A | 7/2013 | |
| KR | 102250066 B1 * | 5/2021 | ........... B01D 53/005 |

* cited by examiner

[FIG. 1]
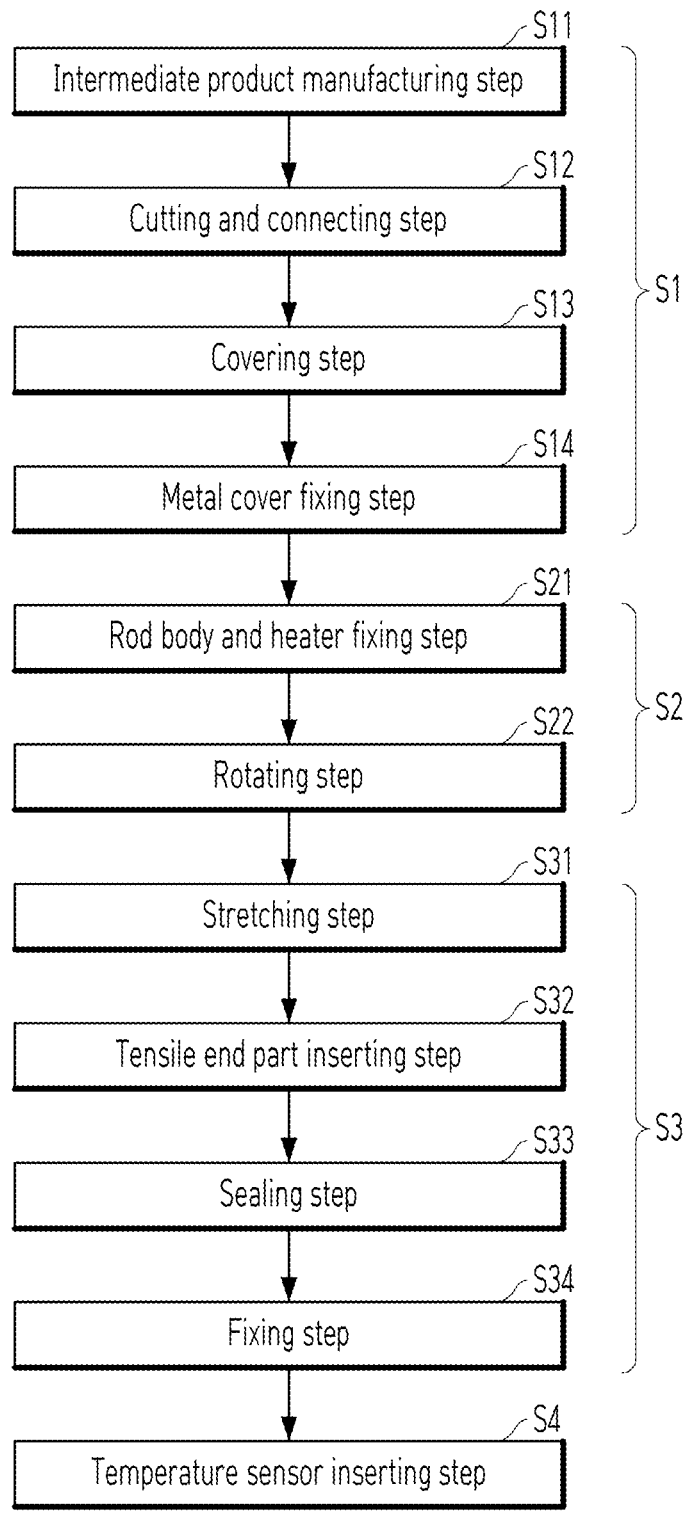

[FIG. 2]
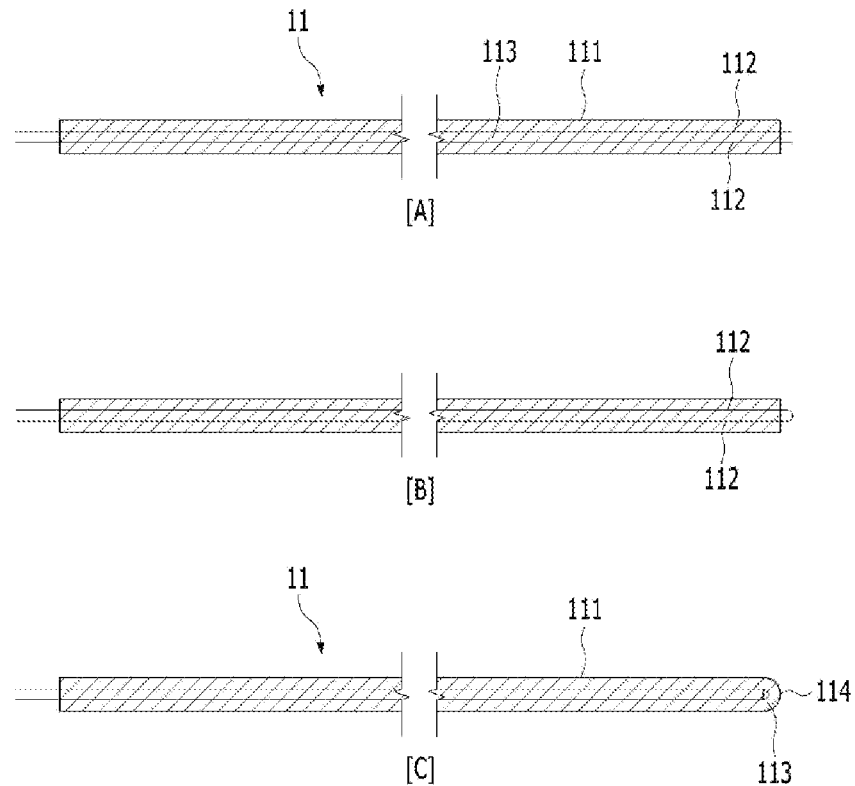
[FIG. 3]
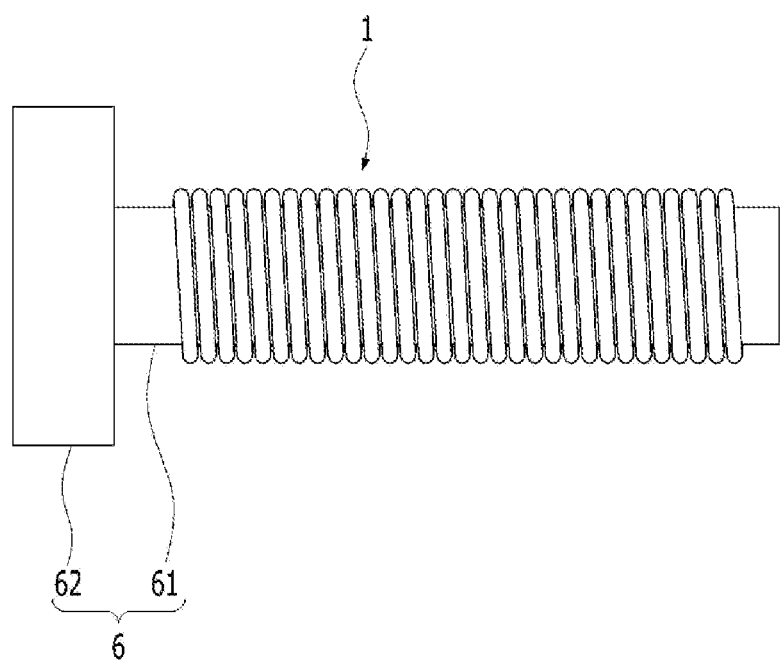

[FIG. 4]
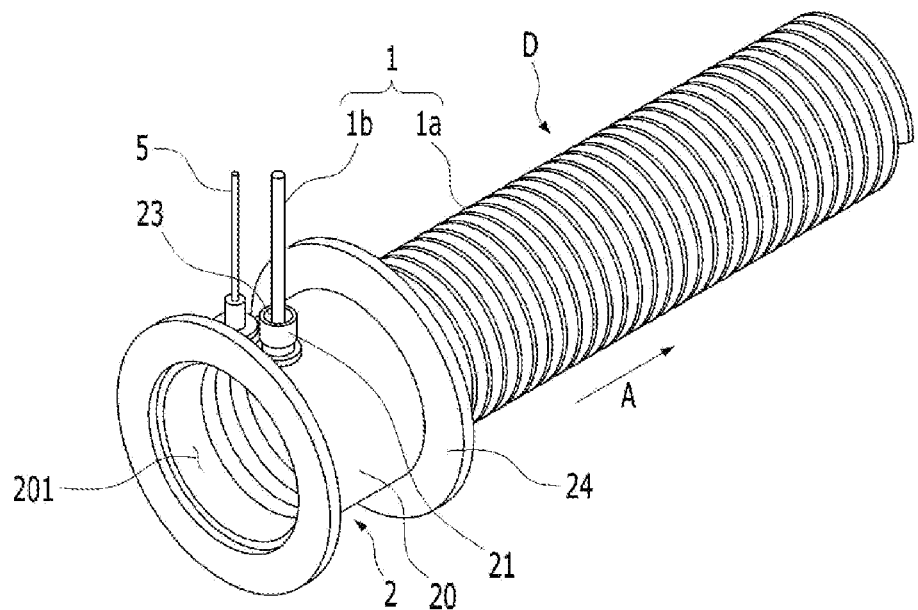
[FIG. 5]
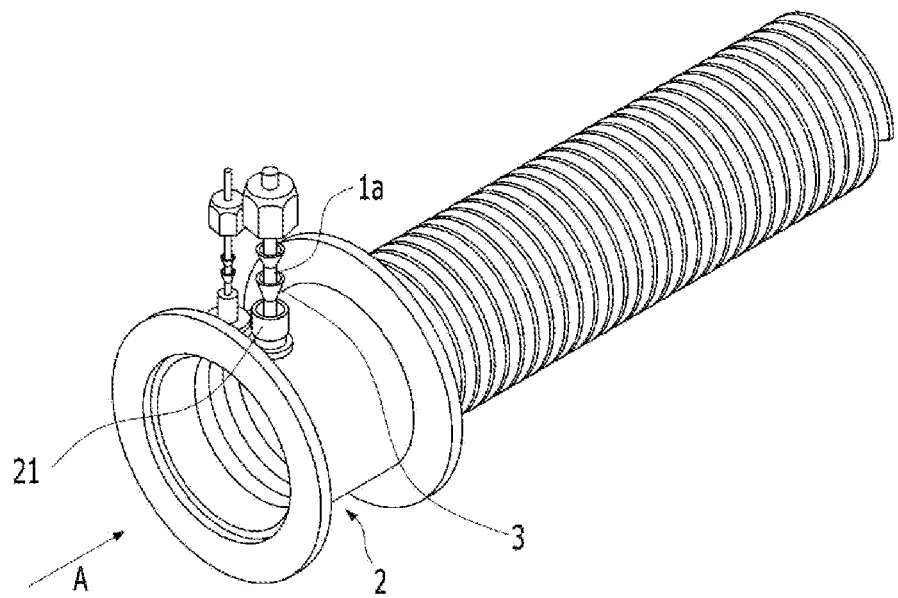

[FIG. 6]
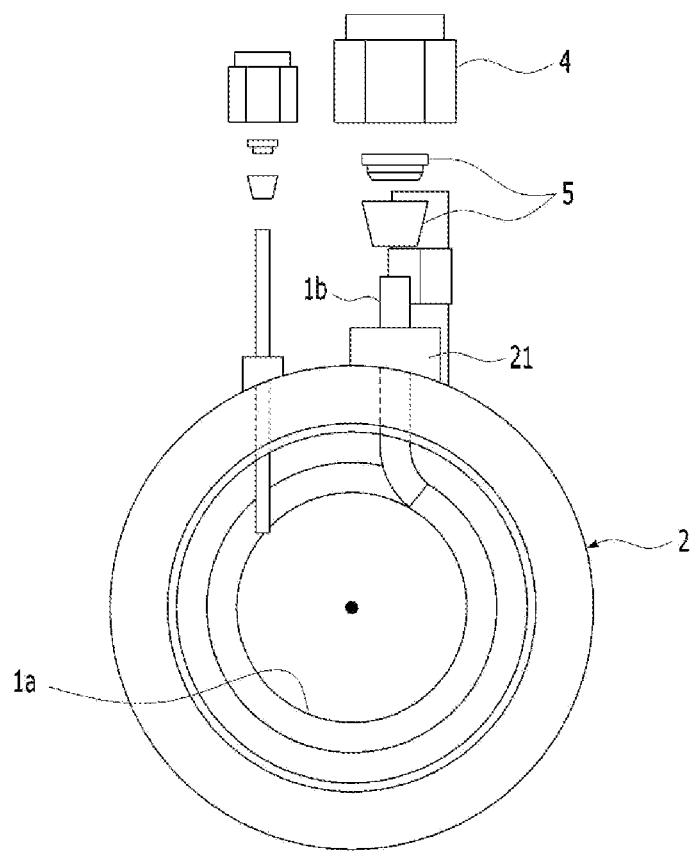
[FIG. 7]
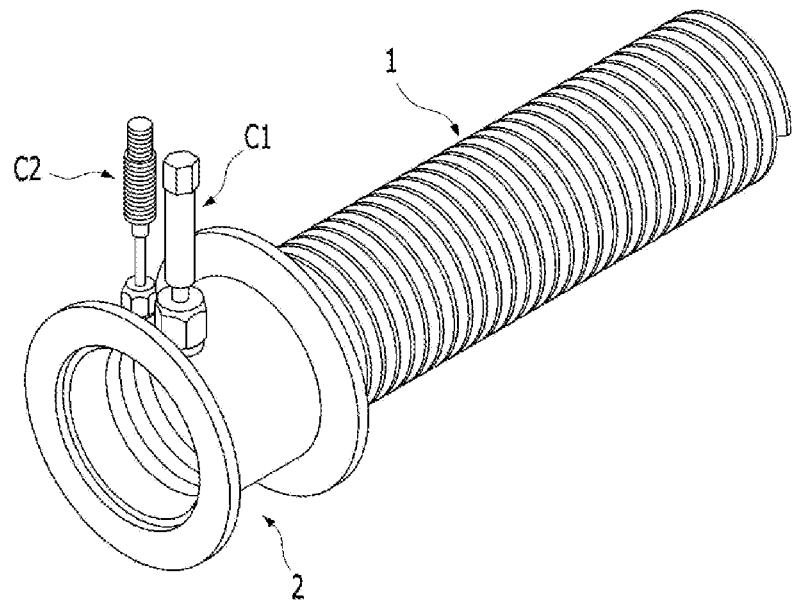

[FIG. 8]
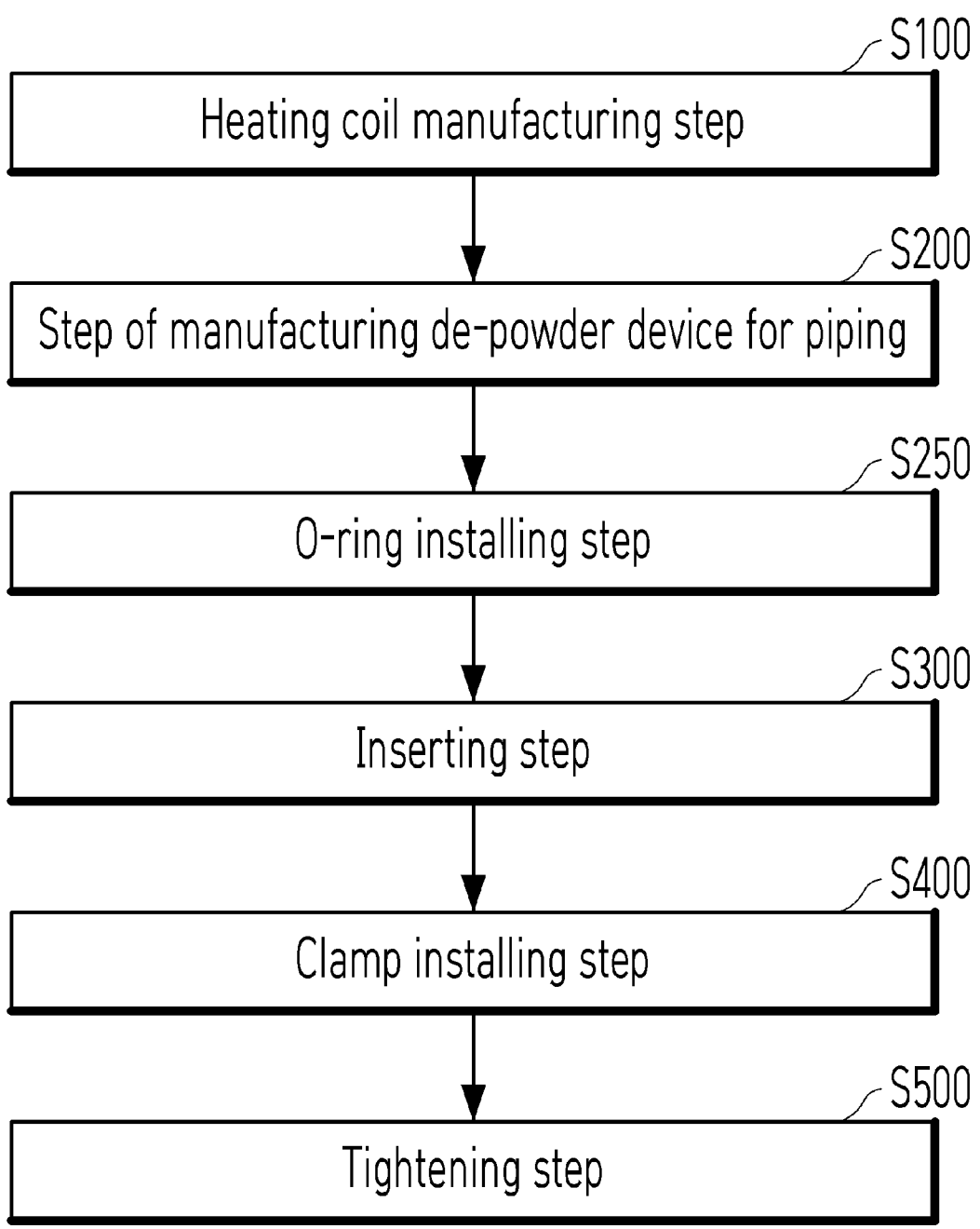

[FIG. 9]
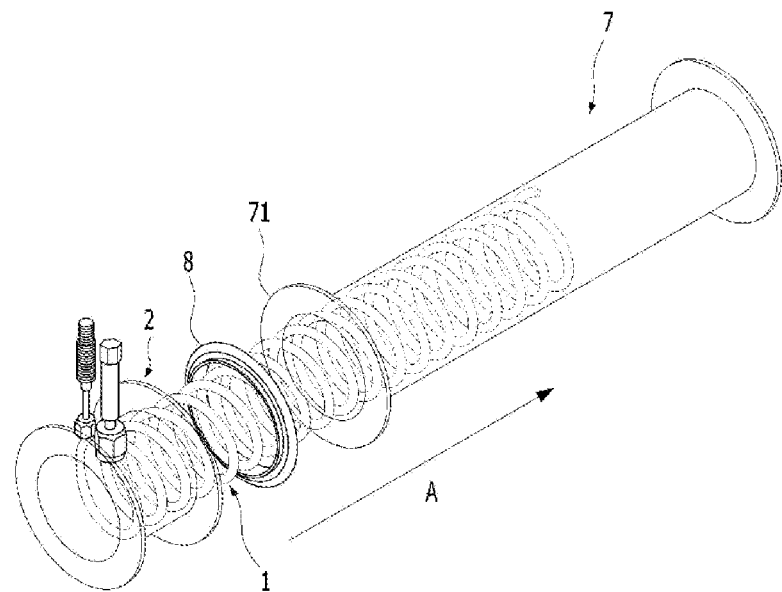
[FIG. 10]
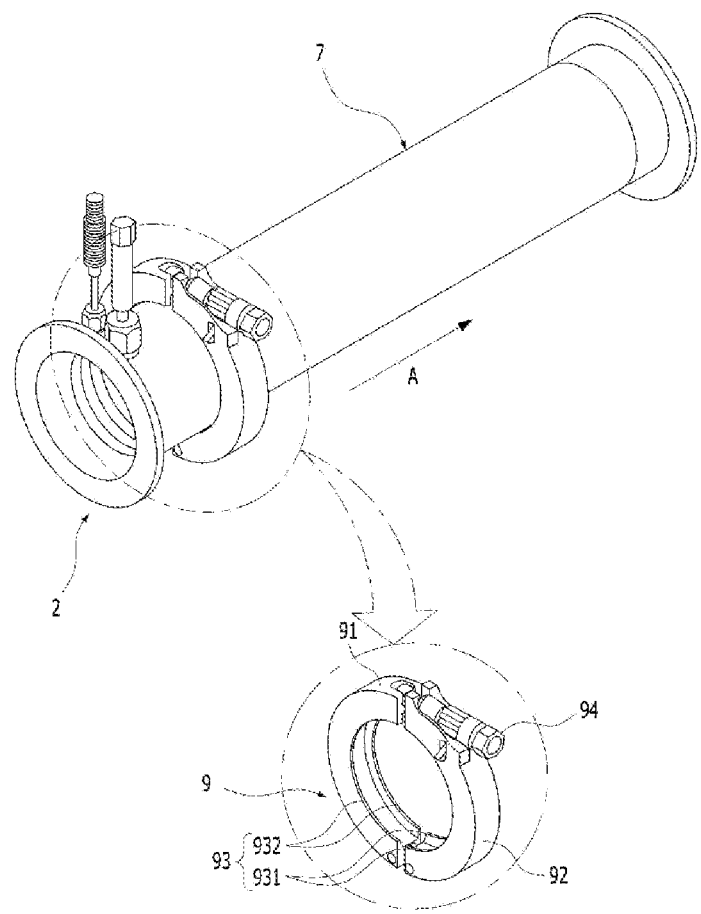

[FIG. 11]
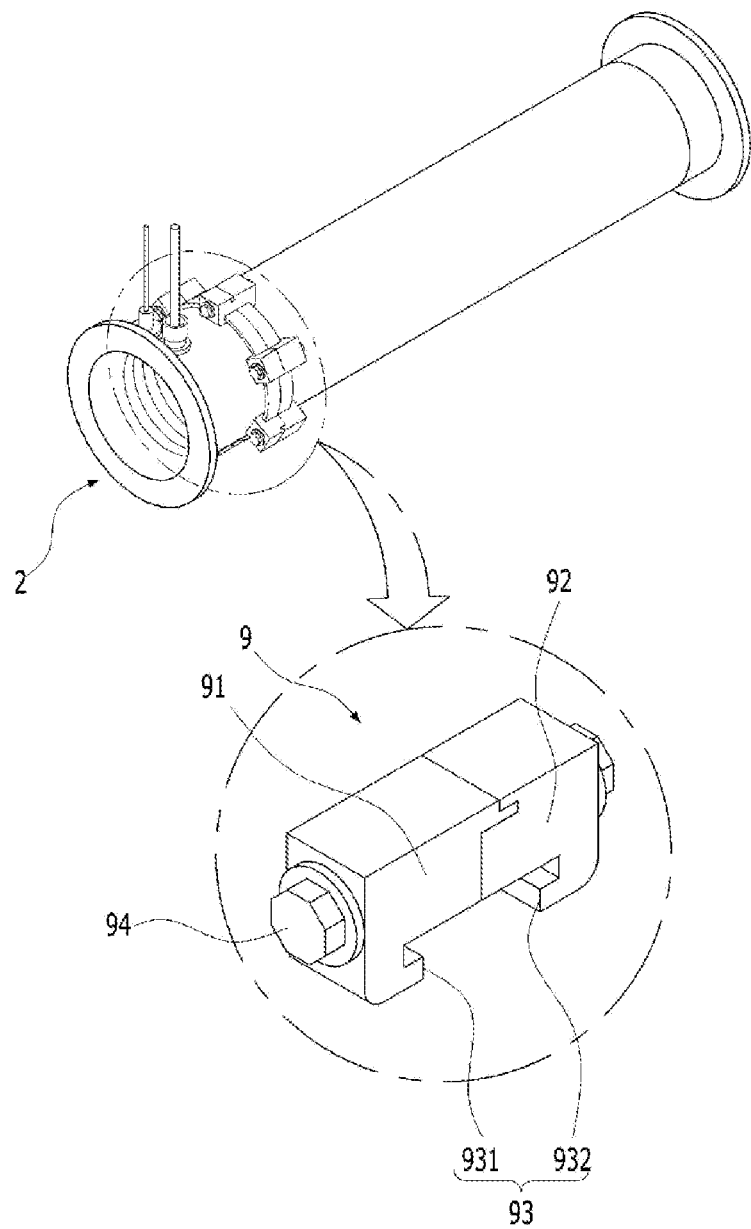

METHOD FOR MANUFACTURING DE-POWDER DEVICE FOR PIPING, AND METHOD FOR INSTALLING SAME

TECHNICAL FIELD

The present disclosure relates to a method for manufacturing a de-powder device for piping and a method for installing the same, and more particularly, to a method for manufacturing a de-powder device for piping, which is for suppressing attachment and deposition of exhaust matters to an inner circumferential surface of a pipe exposed to the flow of exhaust matters such as unreacted raw material gas, reaction products, and the like exhausted from substrate processing devices for semiconductors and displays, and a method for installing the same.

BACKGROUND ART

In general, a semiconductor manufacturing process largely consists of a preprocess (fabrication process) and a post-process (assembly process).

The preprocess is a process of manufacturing semiconductor chips by processing specific patterns by repeatedly performing a process of depositing a thin film on a wafer within various process chambers and selectively etching the deposited thin film. In addition, the post-process refers to a process of individually separating the chips manufactured in the preprocess and then assembling them into finished products by combining them with a lead frame.

At this time, in the case of a process of depositing a thin film on a wafer or etching the thin film deposited on the wafer, it is performed at high temperatures using a harmful gas within a process chamber. While such a process is performed, a large amount of various ignitable gases, corrosive foreign substances, and gases containing toxic components are generated inside the process chamber. That is, only about 30% of the harmful gas is deposited on the surface of the wafer within the process chamber, and some unreacted gas is discharged.

Accordingly, a scrubber for purifying the gas discharged from the process chamber and discharging it to the atmosphere is installed at a rear end of the vacuum pump that makes the process chamber be in a vacuum state.

However, the gas is solidified and changed into powder between the process chamber and the vacuum pump, and the powder is stuck to the fore line and the exhaust line to increase the exhaust pressure and at the same time, when the powder flows into the vacuum pump, there has been a problem in that it caused a breakdown of the vacuum pump. That is, reaction by-products in the gas discharged from the process chamber to the pump are stuck to the inner walls of the fore line and exhaust line to cause a clogging phenomenon of the fore line and exhaust line, and are stuck to the body of the vacuum pump to damage the vacuum pump, thereby shortening its lifespan.

Efforts to solve this problem have been studied in various ways, and one of the representative methods has been proposed as a method for arranging a heating jacket on the outer surface of a fore line or an exhaust line. However, since this is an indirect heating method, there has been a problem in that powder removal efficiency is low, and as a result, conversion to a direct heating method has been required.

The background technology of the present application is disclosed in KR 1020070030615 A and KR 200366263 Y1.

SUMMARY OF INVENTION

Technical Problem

The present disclosure has been made to solve the above-described problems, and an object of the present disclosure is to provide a method for manufacturing a de-powder device for piping, which is capable of efficiently suppressing the attachment and deposition of the exhaust matters to a piping system, and a method for installing the same.

Another object of the present disclosure is to provide a method for manufacturing a de-powder device for piping that is easily manufactured and a method for installing the same.

Solution to Problem

The present disclosure for the purpose of solving the above-described problems has the following configuration and characteristics.

A method for manufacturing a de-powder device for piping includes: a heater manufacturing step (S1) including a step (S11) of manufacturing an intermediate product by installing a heating wire connected to a power source inside a metal pipe and filling it with an insulating agent and a step (S12) of cutting the intermediate product and connecting one end portions of exposed heating wires; a winding step (S2) of manufacturing a heating coil which has a predetermined outer diameter by winding the heater around a jig and at least a portion of which is inserted into a pipe; and a coupling step (S3) of coupling the flange and the heating coil by inserting an end portion of the heating coil into an exposed hole formed in a metal flange.

In addition, the step (S12) may include: a step (S121) of exposing both end portions of a pair of heating wires installed inside the metal pipe by cutting both end portions of the metal pipe and both end portions of the insulating agent; and a step (S122) of connecting one end to the other of the pair of heating wires.

In addition, the heater manufacturing step (S1) may further include: a step (S13) of covering one of openings on both sides of the metal pipe where a portion where a pair of heating wires are connected is exposed with a metal cover of which the inside is filled with the insulating agent; and a step (S14) of connecting the metal pipe to the metal cover.

In addition, the winding step (S2) may include: a step (S21) of fixing one end portion of the heater to a rod body of the jig; and a step (S22) of rotating the rod body in a state in which the other end portion of the heater is fixed.

In addition, the coupling step (S3) may include: a step (S31) of forming a tensile end part by stretching the end portion of the heating coil; and a step (S32) of inserting the tensile end part into the exposed hole.

In addition, the coupling step (S3) may further include a step (S33) of blocking the exposed hole through which the end portion of the heating coil penetrates with a sealing member.

The coupling step (S3) may further include a step (S34) of fixing an exposed portion of the heating coil with a fixing member in a state in which a portion of the heating coil is exposed to the outside of the exposed hole.

The method for manufacturing a de-powder device for piping may further include a step (S4) of inserting the temperature sensor through a second exposed hole formed in the metal flange so that a measuring part of a temperature sensor is located inside the metal flange.

A method for installing a de-powder device for piping includes: a heating coil manufacturing step (S100) including a process of installing a heating wire inside the metal pipe and filling it with the insulating agent; a step (S200) of manufacturing a de-powder device for piping by inserting an end portion of the heating coil into an exposed hole formed in a metal flange and coupling the metal flange and the heating coil; and a step (S300) of inserting a portion of the heating coil into a pipe.

The method for installing a de-powder device for piping may further include a step (S250), which is performed before the step (S300), of penetrating the heating coil through the O-ring so that an O-ring is disposed between the flange and the pipe in the step (S300).

The method for installing a de-powder device for piping may further include: a step (S400) of installing a locking means, which includes a first body, a second body connected to the first body, a movement limiting jaw provided on the first body and the second body, and a tightening member for adjusting a distance between end portions of the first body and the second body, at a connecting region between the flange and the pipe; and a step (S500) of coupling the flange and the pipe to each other by adjusting the distance between the end portions of the first body and the second body through the tightening member.

Advantageous Effects of Invention

The present disclosure having the above-described configuration and characteristics has an effect capable of efficiently suppressing the attachment and deposition of the exhaust matters to the piping system.

In addition, the present disclosure has an effect of facilitating manufacturing.

BRIEF DESCRIPTION OF DRAWINGS

FIG. 1 is a schematic flowchart for explaining a method for manufacturing a de-powder device for piping according to one embodiment of the present disclosure.

FIG. 2 is a view for explaining a heater manufacturing step.

FIG. 3 is a view for explaining a winding step.

FIG. 4 is a view for explaining a state in which an end portion of a heating coil penetrates an exposed hole so that a flange and the heating coil are coupled.

FIG. 5 is a view for explaining a sealing step and a fixing step.

FIG. 6 is a view of FIG. 5 viewed from a direction A.

FIG. 7 is a view showing a state in which a controller is connected to each of a temperature sensor and a heating coil.

FIG. 8 is a schematic flowchart for explaining a method for installing a de-powder device for piping according to one embodiment of the present disclosure.

FIG. 9 is a view illustrating a process of inserting a portion of the heating coil into a pipe.

FIG. 10 is a view for explaining a state in which the de-powder device for piping and the pipe are fixed by the locking means according to a first embodiment of the present disclosure.

FIG. 11 is a view for explaining a state in which the de-powder device for piping and the pipe are fixed by the locking means according to a second embodiment of the present disclosure.

DESCRIPTION OF EMBODIMENTS

Since the present disclosure can have various changes and various forms, the aspects (or embodiments) will be described in detail in the text. However, this is not intended to limit the present disclosure to a specific form disclosed, and should be understood to include all modifications, equivalents, or substitutes included in the spirit and technical scope of the present disclosure.

Terms used in this specification are only used to describe a specific aspect (or embodiment), and are not intended to limit the present disclosure. Singular expressions include plural expressions unless the context clearly dictates otherwise. In the present application, a term such as ~including~, ~consisting of~, or the like is intended to designate that there is a feature, number, step, operation, component, part, or a combination thereof described in the specification, but it should be understood that it does not preclude the possibility of the presence or addition of one or more other features, numbers, steps, operations, components, parts, or combinations thereof.

Unless defined otherwise, all terms used herein, including technical or scientific terms, have the same meaning as commonly understood by one of ordinary skill in the art to which the present disclosure belongs. Terms such as those defined in commonly used dictionaries should be interpreted as having a meaning consistent with the meaning in the context of the related art, and unless explicitly defined in the present application, they should not be interpreted in an ideal or excessively formal meaning.

First~, Second~, etc. described in this specification will only be referred to in order to distinguish different components from each other, and will not be dependent on the order in which they were manufactured, and the names thereof may not match in the detailed description and claims of the invention.

Throughout this specification, when a part is said to be "connected" to another part, this includes not only the case of being "directly connected" but also the case of being "indirectly connected" with another element interposed in the middle therebetween.

FIG. 1 is a schematic flowchart for explaining a method for manufacturing a de-powder device for piping according to one embodiment of the present disclosure. FIG. 2 is a view for explaining a heater manufacturing step.

A method for manufacturing a de-powder device for piping (a method for manufacturing an inner heater) according to one embodiment of the present disclosure is to manufacture a de-powder device for piping D (inner heater) which is used for a pipe 7 (refer to FIG. 9 to be described later) so that it can efficiently suppress the attachment of the gas to the inside of the pipe in the form of a powder due to cooling and solidification of the gas in the pipe 7, and hereinafter, it will be referred to as 'the present method' for convenience of explanation.

Referring to FIGS. 1 and 2, the present method (method for manufacturing a de-powder device for piping according to one embodiment of the present disclosure) includes a heater manufacturing step (S1), a winding step (S2), and a coupling step (S3).

The heater manufacturing step (S1) includes a step (S11) of manufacturing an intermediate product by installing a heating wire 112 (electric wire) connected to a power source inside a metal pipe 111 and filling an insulating agent 113 (see FIG. 2A).

Illustratively, the metal pipe 111 may be made of stainless steel (SUS), and the inner and outer surfaces of the metal pipe 111 may be coated with chromium nitride (CrN), titanium nitride (TiN), etc. and thus it may have improved wear resistance, corrosion resistance (particularly high temperature corrosion resistance), and etc.

The heating wire 112 may have a longitudinal direction parallel to the longitudinal direction of the metal pipe 111 (the left and right directions in FIG. 2, and in the step (S11), a pair of heating wires 112 may be installed by being inserted into the metal pipe 111.

The insulating agent 113 may be illustratively magnesium oxide, and in the step (S11), the pair of heating wires 112 may be spaced apart from each other, and each of the pair of heating wires 112 and the metal pipe 111 may be spaced apart.

Referring to FIGS. 1 and 2, the heater manufacturing step (S1) includes a step (S12) of cutting the intermediate product to have a predetermined length and connecting one end portions of exposed heating wires 112 (see FIG. 2B).

Describing the above-described step (S12) in more detail, it may include a step (S120) of cutting the intermediate product to have a predetermined length and a step (S121) of cutting (peeling) both end portions of the metal pipe 111 and both end portions of the insulating agent 113 to expose both end portions of the pair of heating wires 112 installed inside the metal pipe 111.

In addition, the step (S12) may include a step (S122) of connecting (electrically connecting) one end of any one of the pair of heating wires 112 to one end of the other one thereof.

One end of each of the pair of heating wires 112 means either end of both ends thereof, and may mean a right end in FIG. 2.

In addition, as described above, the step (S12) includes the steps (S120) to (S122) so that end portions of each of the pair of heating wires 112 are exposed from the metal pipe 111 and connected to a power source, and as described above, one end portions thereof may be electrically connected to each other to receive electricity supplied to the power source to generate heat as an electrical resistor.

That is, an end portion of any one of the pair of heating wires 112 may serve as a positive terminal, and an end portion of the other (exposed end portion) may serve as a negative terminal.

In this way, the present method may include the step (S12) and manufacture a plurality of heaters 11 by cutting one intermediate product into a desired size.

Referring to FIGS. 1 and 2, the heater manufacturing step (S1) may include a step (S13) of covering one (the right opening of the metal pipe 111 based on FIG. 2) of the openings on both sides of the metal pipe 111 where a portion (connecting part) where a pair of heating wires 112 are connected is exposed with a metal cover 114 of which the inside is filled with the insulating agent 113; and a step (S14) of connecting the metal pipe 111 and the metal cover 114 (see FIG. 2C).

The metal cover 114 may also be made of stainless steel (SUS), and in the step S14, the metal pipe 111 and the metal cover 114 may be interconnected and fixed by a method such as welding.

As such, since the heater manufacturing step (S1) of the present method includes the steps (S13) and (S14), there is an advantage in that the above-described connecting part may be effectively protected.

FIG. 3 is a view for explaining a winding step.

Referring to FIGS. 1 and 3, the winding step (S2) is a step of winding the heater 11 around a jig 6 to manufacture a heating coil 1 which has a predetermined outer diameter and at least a portion of which is inserted into the pipe 7.

The jig 6 may illustratively include a rod body 61 and a head 62 provided at an end portion of the rod body 61.

The winding step (S2) may more specifically include a step (S21) of fixing (temporarily fixing) one end portion of the heater 11 to the rod body 61 and a step (S22) of rotating the rod body 61 in a state in which the other end portion of the heater 11 is fixed.

In the step (S21), one end (left end based on FIG. 3) of the heater 11 may be temporarily fixed to one end portion (left end portion based on FIG. 3) of the rod body 61 by various known methods (illustratively bolting coupling, etc.).

In addition, in the step (S22), the rod body 61 may be rotated according to the rotation of the head 62, and as described above, the other end (right end based on FIG. 3) of the heater 11 is fixed, and it is wound around the rod body 61 according to the rotation of the rod body 61 and manufactured into a heating coil 1 in the form of a coil.

In this way, the present method may more easily manufacture the heater 11 as a heating coil 1 in the form of a coil by including the above-described winding step (S3).

Thereafter, a temporary fixing state of the heating coil 1 and the rod body 61 is released so that the heating coil 1 may be separated from the rod body 61.

As described above, the heating coil 1 is said to have a predetermined outer diameter, but the outer diameter of the heating coil 1 may correspond to or be slightly smaller than the inner diameter of the pipe 7 to be described later.

FIG. 4 is a view for explaining a state in which an end portion of a heating coil penetrates an exposed hole so that a flange and the heating coil are coupled.

Referring to FIGS. 1 and 4, the coupling step (S3) is a step of coupling the flange 2 and the heating coil 1 by inserting an end portion of the heating coil 1 (the tensile end part 1b to be described later) into the exposed hole 23 formed in the metal flange 2 (flange made of metal).

Illustratively, the flange 2 may include a pipe body 20 having a hollow 201 formed in an inner side thereof, a hole formed to penetrate the inside and outside of the pipe body 20, a protrusion part 21 provided to protrude to an outer side from the outer surface of the pipe body 20, and a through hole formed along the longitudinal direction (the protrusion direction of the protrusion part 21) inside the protrusion part 21 and communicating with the hole. The exposed hole 23 may be formed by the through hole and the hole.

Here, the inner side means the inner center line side of the flange 2 and the pipe 7, the inner center line means a center line parallel to the forward direction (parallel to the longitudinal direction of the pipe 7) of FIG. 4 and FIG. 9 described later, the outer side means a radial direction from the center line, and the same will be applied in the following description.

At this time, the coupling step (S3) may include a step (S31) of forming the tensile end part (1b) by stretching the end portion of the heating coil 1.

That is, after the step (S31), the heating coil 1 may be composed of a coil part 1a formed by winding the heater 11 and a tensile end part 1b formed in a straight line form by being stretched from the end portion of the coil part 1a.

The coupling step (S3) may include a step (S32) of inserting the tensile end part 1b into the exposed hole 23.

In this way, the present method includes the step (S31) of forming the above-described tensile end part 1b so that there is an advantage in that the end portion of the heating coil 1 is easily inserted into the exposed hole 23, and thus coupling of the heating coil 1 and the flange 2 may be performed more easily.

FIG. 5 is a view for explaining a sealing step and a fixing step. FIG. 6 is a view of FIG. 5 viewed from a direction A.

Referring to FIG. 1 and FIGS. 4 to 6, the coupling step (S3) may include a step (S33) of blocking the exposed hole 23 through which the end portion of the heating coil 1 (tensile end part 1b) penetrates with the sealing member 3.

Illustratively, the sealing member 3 may be a ferrule made of metal. The sealing member 3 may be penetrated by the tensile end part 1b and move downward on the tensile end part 1b to block the exposed hole 23 through which the tensile end part 1b penetrates. Illustratively, the sealing member 3 may include a lower member whose width decreases toward the lower side and whose outer diameter is larger than the diameter of the exposed hole 23 and an upper member disposed above the lower member.

In this way, the present method includes a step (S33) of blocking the exposed hole 23 with the sealing member 3 so that there is an advantage in that it may be possible to suppress the fluid from moving through the exposed hole 23 (first exposed hole) through which the end portion of the heating coil 1 penetrates.

In addition, the coupling step (S3) may further include a step (S23) of fixing the exposed portion of the heating coil 1 with a fixing member 4 in a state in which a portion of the heating coil 1 is exposed to the outside of the exposed hole 23.

Illustratively, the fixing member 4 may be a nut. Illustratively, the nut is screw-coupled to a screw thread formed on the outer circumference of the tensile end part 1b or the screw thread formed on the protrusion part 21 and moved downward. The nut presses the sealing member 3 (illustratively the lower member) downward so that the sealing member 3 through which the above-described tensile end part 1b is penetrated and inserted may be inserted into the exposed hole 23, and thus the end portion of the heating coil 1 may be coupled to the flange 2.

In this way, the heating coil 1 in the coupling step (S3) is coupled and fixed to the flange 2. The flange 2 described above will be described in more detail in the description to be described later, but is coupled to the pipe 7 in a state in which the heating coil 1 is inserted into the pipe 7.

As such, the present method includes a winding step (S2) of manufacturing a heating coil 1 at least a portion of which is inserted into the pipe 7 and a coupling step (S3) of coupling a flange 2 and a heating coil 1 that are capable of being coupled to the pipe 7, and thus there are advantages in that the gas may be suppressed from being cooled and powdered by heating a gas inside the pipe 7, and attachment of powder to the inside of the pipe 7 may be suppressed more efficiently compared to the conventional technology of heating the outside of the pipe 7.

FIG. 7 is a view showing a state in which a controller is connected to each of a temperature sensor and a heating coil.

Referring to FIG. 1 and FIGS. 4 to 7, the present method may include a temperature sensor insertion step (S4) of inserting the temperature sensor 5 through the second exposed hole formed in the flange 2 so that the measuring part of the temperature sensor 5 is located inside the flange 2. Since the temperature sensor 5 is known, a more detailed description thereof will be omitted.

Similarly, it goes without saying that the second exposed hole may also be sealed through a configuration corresponding to the sealing member 3, and the fixing member 4 may be fixed to the flange 2 through a configuration corresponding to the fixing member 4.

The tensile end part 1b of the heating coil 1 may be electrically connected to a device such as a heater power controller connecting part, and the temperature sensor 5 may also be connected to a device such as a temperature sensor controller connecting part.

In this way, the present method includes the temperature sensor insertion step (S4) to grasp the temperature inside the pipe 7 in real time so that the heating value of the heating coil 1 (the amount of power supplied to the heating coil 1) may be controlled to adjust the temperature inside the pipe 7.

FIG. 8 is a schematic flowchart for explaining a method for installing a de-powder device for piping according to one embodiment of the present disclosure. FIG. 9 is a view illustrating a process of inserting a portion of the heating coil into a pipe.

Hereinafter, a method for installing a de-powder device for piping according to one embodiment of the present disclosure (hereinafter referred to as 'the present installation method') will be described. However, the present installation method is a method for installing the de-powder device D for piping manufactured by the present method described above, and since it includes technical features that are the same as or correspond to the de-powder device D for piping manufactured by the above-described present method or the present method, the same reference numerals are used for the same or similar configurations as the pre-examined configurations, and redundant descriptions will be simplified or omitted.

Referring to FIGS. 4, 8 and 9, the present installation method (method for installing a de-powder device for piping according to one embodiment of the present disclosure) includes a heating coil manufacturing step (S100), a step (S200) of manufacturing a de-powder device for piping, and an insertion step (S300).

The heating coil manufacturing step (S100) includes a process of installing the heating wire 112 inside the metal pipe 111 and filling the insulating agent 113 (hereinafter referred to as a first process).

The above-described first process is a process corresponding to the step (S11) in the present method described above, and the description of the first process will be replaced with the description of the step (S11).

In addition, the heating coil manufacturing step (S100) may include the heater manufacturing step (S1) and the winding step (S2) described above in the present method.

Therefore, the heating coil 1 described above may be manufactured in the heating coil manufacturing step (S100).

In addition, the present installation method includes a step (S200) of manufacturing a de-powder device for piping in which the end portion of the heating coil 1 is inserted into the exposed hole 23 formed in the metal flange 2, and the flange 2 and the heating coil 1 are coupled to manufacture a de-powder device D for piping.

The step (S200) of manufacturing a de-powder device for piping, which is described above, corresponds to the above-described coupling step (S3) of the present method, and the description of the step (S200) of manufacturing a de-powder device for piping will be replaced with the description of the above-described coupling step (S3).

Referring to FIGS. 8 and 9, the insertion step (S300) is a step of inserting a portion of the heating coil 1 into the pipe 7.

As described above, the heating coil 1 is said to include a coil part 1a wound in a coil shape and a tensile end part 1b, and at least a portion of the coil part 1a is inserted into the pipe 7 in the above-described insertion step (S300).

The pipe 7 and the de-powder device D for piping are connected and fixed to each other by a locking means 9 to be described later, and thus a portion of the heating coil 1 is installed inside the pipe 7.

The present installation method may include a step (S250) of penetrating the heating coil 1 through the O-ring 8 so that the O-ring 8 is disposed between the flange 2 and the pipe 7 in the insertion step (S300).

The step (S250) may be performed after the step (S200) of manufacturing a de-powder device for piping and may be performed before the insertion step (S300).

Therefore, in the state where the heating coil 1 is inserted by penetrating the O-ring 8, when the flange 2 is moved toward the pipe 7 so that the heating coil 1 is inserted into the pipe 7 in the step (S300), the O-ring 8 is disposed between the rear end of the flange 2 and the front end of the pipe 7. The O-ring 8 may be illustratively made of a resin material.

Here, the forward (front end or the like) means the reverse direction of the 'A' direction (reverse direction side of the 'A' direction, or the like) with respect to FIG. 9, and the backward (rear end or the like) refers to the 'A' direction ('A' direction side, or the like) with respect to FIG. 9, and this will be equally applied in the following description.

In this way, the present method includes the step (S250), thereby enabling sealing to be made between the pipe 7 and the flange 2, and thus there is an advantage in that fluid and foreign substances may be suppressed from being moved between the pipe 7 and the flange 2.

FIG. 10 is a view for explaining a state in which the de-powder device for piping and the pipe are fixed by the locking means according to the first embodiment of the present disclosure. FIG. 11 is a view for explaining a state in which the de-powder device for piping and the pipe are fixed by the locking means according to the second embodiment of the present disclosure.

Referring to FIGS. 8 to 11, the present installation method may include a step (S400) of installing a locking means 9 (clamp), which includes a first body 91, a second body 92 connected to the first body 91, a movement limiting jaw 93 provided on the first body 91 and the second body 92, and a tightening member 94 for adjusting a distance between end portions of the first body 91 and the second body 92, at a connecting region between the flange 2 and the pipe 7, and a step (S500) of coupling the flange 2 and the pipe 7 to each other by adjusting the distance between the end portions of the first body 91 and the second body 92 through the tightening member 94.

Referring to FIGS. 9 and 10, the first body 91 and the second body 92 of the locking means 9 (hereinafter referred to as the first clamp) according to the first embodiment of the present disclosure each have a semicircular shape, and the first body 91 and the second body 92 are coupled to each other so that the lower ends thereof are each rotatable in a state in which the first body 91 and the second body 92 face each other so as to surround the connecting region.

The first clamp surrounds the connecting region. At this time, the movement limiting jaw 93 may include a front limiting jaw 931 provided to protrude inward from the front end of each of the first body 91 and the second body 92, and a rear limiting jaw 932 provided to protrude inward from the rear end of each of the first body 91 and the body 92.

The flange 2 may include a wing part 24 provided to protrude outward from the rear end of the pipe body 20, and the pipe 7 may include a rim part 71 provided to protrude outward from the front end. The above-described front limiting jaw 931 is disposed in front of the wing part 24, and the rear limiting jaw 932 is disposed at the rear of the rim part 71 so that forward and backward movements of the de-powder device D for piping and the pipe 7 are limited.

The tightening member 94 of the first clamp is to adjust the distance between the upper end portions of the first body 91 and the second body 92, and the tightening member 94 may be a bolt member illustratively.

The bolt member is a commonly known one including a body part having a screw thread and a head part which is provided at an end portion of the body part and has a larger outer diameter than the body part.

The bolt member is screw-fastened into the nut hole formed in the first body 91 in a state in which it penetrates the second body 92 so that the head part of the bolt member presses the second body 92 toward the first body 91 or releases the pressurization to adjust the distance between the first body 91 and the second body 92, and thus the connecting region of the first body 91 and the second body 92 may be tightened or tightening thereof may be released.

In this way, as the distance between upper ends of the first body 91 and the second body 92 narrows, the locking means 9 surrounds and tightens the above-described connecting region, and thus the pipe 7 and the flange 2 may be coupled to each other.

Referring to FIGS. 9 and 11, the tightening member 94 of the locking means 9 (hereinafter referred to as the second clamp) according to the second embodiment of the present disclosure may be a bolt member, and a bolt hole that is screw-fastened to the above-described bolt member 9 may be formed in the front of the second body 92.

At this time, a bolt hole through which the body of the bolt member penetrates may be formed in the first body 91, the rear end portion is fastened to the second body 92 in a state where the body of the bolt member penetrates the first body 91, and the head part provided at the front end of the body part of the bolt member presses the first body 91 toward the second body 92 to adjust the separation distance between the first body 91 and the second body 92.

At this time, the movement limiting jaw 93 may include a front limiting jaw 931 provided to protrude inward from the inner front end portion of the first body 91 described above, and may include a rear limiting jaw 932 provided to protrude inward from the inner rear end portion of the second body 92.

The front limiting jaw 931 may be disposed in front of the wing part 24, and the rear limiting jaw 932 may be disposed in rear of the rim part 71.

As described above, when the separation distance between the front limiting jaw 931 and the rear limiting jaw 932 is narrowed by the tightening member 94, the pipe 7 and the flange 2 may be coupled to each other.

The present disclosure described above with reference to the accompanying drawings can be variously modified and changed by those skilled in the art, and these modifications and changes should be construed as being included in the scope of the present disclosure.

The invention claimed is:

1. A method for manufacturing a de-powder device for piping comprising: a heater manufacturing step (S1) comprising a step (S11) of manufacturing an intermediate product by installing a heating wire inside a metal pipe and filling it with an insulating agent and a step (S12) of cutting the intermediate product to manufacture heaters and connecting end portions of exposed heating wires; a winding step (S2) of manufacturing a heating coil which has a predetermined outer diameter by winding a heater of the manufactured heaters around a jig, the jig comprising a rod body and a head, the winding step (S2) comprising a step (S21) of fixing one end portion of the heater on the rod body and a step (S22) of rotating the rod body in a state that the other end portion of the heater is fixed and separating the manufactured heating coil from the rod body; a coupling step (S3) of coupling a flange and the heating coil by inserting an end portion of the heating coil into an exposed hole formed on the flange, wherein the heater manufacturing step (S1) further comprises: a step (S13) of covering one of openings on both sides of the metal pipe that is exposed with a metal cover of which the inside is filled with the insulating agent; and a step (S14) of connecting the metal pipe to the metal cover.

2. The method for claim 1, wherein the step (S12) comprises:
   a step (S121) of exposing both end portions of a pair of heating wires installed inside the metal pipe by cutting both end portions of the metal pipe and both end portions of the insulating agent; and
   a step (S122) of connecting one end of any one to one end of the other one of the pair of heating wires.

3. The method for claim 1, wherein the coupling step (S3) comprises:
   a step (S31) of forming a tensile end part by stretching the end portion of the heating coil; and
   a step (S32) of inserting the tensile end part into the exposed hole.

4. The method for claim 1, wherein the coupling step (S3) further comprises a step (S33) of blocking the exposed hole through which the end portion of the heating coil penetrates with a sealing member.

5. The method for claim 1, wherein the coupling step (S3) further comprises a step (S34) of fixing an exposed portion of the heating coil with a fixing member in a state in which a portion of the heating coil is exposed to the outside of the exposed hole.

6. The method for claim 1, further comprising a step (S4) of inserting the temperature sensor through a second exposed hole formed in the metal flange so that a measuring part of a temperature sensor is located inside the metal flange.

7. A method for installing a de-powder device for piping, the method comprising:
   a heating coil manufacturing step (S100) comprising a process of installing a heating wire inside a metal pipe and filling it with an insulating agent;
   a step (S200) of manufacturing a de-powder device for piping by inserting an end portion of a heating coil into an exposed hole formed on a metal flange and coupling the metal flange and the heating coil; and
   a step (S300) of inserting a portion of the heating coil into a conduit,
   wherein the heating coil manufacturing step (S100) comprises a heater manufacturing step (S1), which comprises a step (S11) of manufacturing an intermediate product by installing the heating wire inside the metal pipe and filling it with the insulating agent and a step (S12) of cutting the intermediate product and connecting end portions of exposed heating wires, and
   wherein the heater manufacturing step (S1) further comprises:
   a step (S13) of covering one of openings on both sides of the metal pipe where a portion to which a pair of heating wires are connected is exposed with a metal cover of which an inside is filled with the insulating agent; and
   a step (S14) of connecting the metal pipe to the metal cover.

8. The method of claim 7, further comprising a step (S250), which is performed before the step (S300), of penetrating the heating coil through the O-ring so that an O-ring is disposed between the flange and the pipe in the step (S300).

9. The method of claim 7, further comprising:
   a step (S400) of installing a locking means, which comprises a first body, a second body connected to the first body, a movement limiting jaw provided on the first body and the second body, and a tightening member for adjusting a distance between end portions of the first body and the second body, at a connecting region between the flange and the pipe; and
   a step (S500) of coupling the flange and the pipe to each other by adjusting the distance between the end portions of the first body and the second body through the tightening member.

\* \* \* \* \*